(12) United States Patent
Yu

(10) Patent No.: US 7,009,228 B1
(45) Date of Patent: Mar. 7, 2006

(54) GUARD RING STRUCTURE AND METHOD FOR FABRICATING SAME

(75) Inventor: Ho-Yuan Yu, Saratoga, CA (US)

(73) Assignee: Lovoltech, Incorporated, Santa Clara, CA (US)

( * ) Notice: Subject to any disclaimer, the term of this patent is extended or adjusted under 35 U.S.C. 154(b) by 0 days.

(21) Appl. No.: 10/379,768

(22) Filed: Mar. 4, 2003

(51) Int. Cl.
  *H01L 29/80* (2006.01)
(52) U.S. Cl. .................................. 257/256; 257/288
(58) Field of Classification Search .............. 257/288, 257/242, 244, 256, 369, 900
  See application file for complete search history.

(56) References Cited

U.S. PATENT DOCUMENTS

| | | | | |
|---|---|---|---|---|
| 4,523,111 A | * | 6/1985 | Baliga | 327/388 |
| 4,645,957 A | * | 2/1987 | Baliga | 327/430 |
| 5,321,283 A | * | 6/1994 | Cogan et al. | 257/256 |
| 5,686,330 A | * | 11/1997 | Farb et al. | 438/193 |
| 6,251,716 B1 | * | 6/2001 | Yu | 438/186 |
| 6,396,090 B1 | * | 5/2002 | Hsu et al. | 257/242 |
| 6,455,378 B1 | * | 9/2002 | Inagawa et al. | 438/270 |
| 6,767,783 B1 | * | 7/2004 | Casady et al. | 438/234 |
| 6,780,714 B1 | * | 8/2004 | Gajda et al. | 438/270 |

OTHER PUBLICATIONS

H. Ogiwara, M. Hayakawa, T. Nishimura and M. Nakaoka; "High-Frequency Induction Heating Inverter with Multi-Resonant Mode Using Newly Developed Normally-Off Type Static Induction Transistors"; Department of Electrical Engineering, Ashikaga Institute of Technology, Japan; Department of Electrical Engineering, Oita University, Japan; Department of Electrical Engineering, Kobe University, Japan; pp. 1017-1023.

J. Baliga; "Highvoltage Junction-Gate Field Effect Transistor with Recessed Gates"; IEEE Transactions on Electron Devices; vol. ED-29; No. 10; Oct. 1982.

J. M. C. Stork et al.; "Small Geometry Depleted Base Bipolar Transistors (BSIT)- VLSI Devices?"; IEEE Transactions on Electron Devices; vol. ED-28; No. 11; Nov. 1981.

Nishizawa et al.; "Analysis of Static Characteristics of a Bipolar Mode SIT (BSIT)"; IEEE Transactions on Electron Devices; vol. ED-29; No. 11; Aug. 1982.

Caruso et al.; "Performance Analysis of a Bipolar Mode FET (BMFET) with Normally Off Characteristics"; IEEE Transactions on Power Electronics; vol. 3; No. 2; Apr. 1988.

Nishizawa et al.; "Fieldeffect Transistor Versus Analog Transistor (Static Induction Transistor)"; IEEE Transactions on Electron Devices; vol. ED-24; No. 4; Apr. 1975.

* cited by examiner

*Primary Examiner*—Howard Weiss
*Assistant Examiner*—(Vikki) Hoa B. Trinh
(74) *Attorney, Agent, or Firm*—Wagner, Murabito & Hao LLP

(57) ABSTRACT

A method for fabricating a guard ring structure for JFETs and MESFETs. Trenches are etched in a semiconductor substrate for fabrication of a gate structure for a JFET or MESFET. At time the gate trenches are etched, concentric guard ring trenches are also etched. The process used to fabricate the gate p-n junction or Schottky barrier at the bottom of the gate trenches is also used to fabricate the guard ring at bottom of the guard ring trenches. The separation between the guard ring trenches is 1.0 to 3.0 times greater than the separation between the gate trenches.

17 Claims, 5 Drawing Sheets

US 7,009,228 B1

GUARD RING STRUCTURE AND METHOD FOR FABRICATING SAME

FIELD OF THE INVENTION

Embodiments of the present invention relate to field effect transistors (FETs). In particular, embodiments of the present invention relate to a guard ring structure for improved breakdown characteristics in FETs.

BACKGROUND ART

Junction field effect transistors (JFETs) are majority carrier devices that conduct current through a channel that is controlled by the application of a voltage to a p-n junction. JFETs may be constructed as p-channel or n-channel and may be operated as enhancement mode devices or depletion mode devices. Similar to the JFET is the metal-semiconductor field effect transistor (MESFET). In MESFETs, a junction between a metal and a semiconductor is used to create a Schottky barrier that takes the place of the p-n junction of the JFET.

The most common JFET type is the depletion mode type. The depletion mode device is a "normally on" device that is turned off by reverse biasing the p-n junction so that pinch-off occurs in the conduction channel. P-channel depletion mode devices are turned off by the application of a positive voltage between the gate and source (positive $V_{gs}$), whereas n-channel depletion mode devices are turned off by the application of a negative voltage between the gate and source (negative $V_{gs}$). Since the junction of a depletion mode JFET is reverse biased in normal operation, the input voltage $V_{gs}$, can be relatively high. However, the supply voltage between the drain and source ($V_{ds}$) is usually relatively low when the device is turned on.

Prior Art FIG. 1 shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions. In operation, the voltage variable width of the depletion regions 13 is used to control the effective cross-sectional area the of conductive channel region 14. The application of a voltage $V_{gs}$ between the gates 10 and source 12 will cause the conductive channel region to vary in width, thereby controlling the resistance between the drain 11 and the source 12. A reverse bias, (e.g., a negative $V_{gs}$), will cause the depletion regions to expand, and at a sufficiently negative value cause the conductive channel to "pinch off", thereby turning off the device.

The width of the depletion regions 13 and the conductive channel region 14 are determined by the width of the n-doped region and the dopant levels in the n-doped and p-doped regions. If the device shown in FIG. 1 were constructed with a narrow n-doped region, such that the two depletion regions merged into a single continuous depletion region and the conductive channel region 14 had zero width, the result would be the device shown in FIG. 2.

Enhancement mode, or "normally off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. P-channel enhancement mode JFETs are turned on by the application of a negative $V_{gs}$, and n-channel enhancement mode JFETs are turned on by the application of a positive $V_{gs}$. The input gate voltage of an enhancement mode JFET is limited by the forward voltage of the p-n junction.

Prior Art FIG. 2 shows a general schematic of an n-channel enhancement mode JFET with $V_{gs}=V_{ds}=0$. The enhancement mode device is "normally off" since the conductive channel width is zero due to the extent of the two depletion regions 13B. The application of a sufficient forward bias (e.g. positive $V_{gs}$) to the device of FIG. 2 will cause the depletion regions 13B to contract, thereby opening a conductive channel.

Although the depletion mode and enhancement mode devices shown schematically in FIG. 1 and FIG. 2 are n-channel devices, depletion mode and enhancement mode devices could be constructed with a reversed doping scheme to provide p-channel devices.

Historically, metal-oxide semiconductor field effect transistors (MOSFETs) have been much more widely used than JFETs, and among JFETs, the depletion mode device has been more widely used than the enhancement mode device. However, the adoption of submicron processes for device fabrication and the resulting higher speeds, lower voltages, and greater current demands in integrated circuits has created new opportunities for the application of JFETs.

JFETs are capable of being driven by low voltages while maintaining excellent breakdown characteristics when compared to MOSFETs. Since there is no insulator associated with gate/drain and gate/source interfaces of a JFET (only a p-n junction), forward bias results in conduction at a voltage that is very low compared to the reverse bias that the device is capable of withstanding. JFETs also have a much greater resistance to damage from electrostatic discharge (ESD) than MOSFETs.

The above mentioned characteristics of the JFET make it attractive for on-chip power conditioning in logic integrated circuits, and for power devices that incorporate control logic. However, when a JFET is integrated into another circuit, breakdown paths may be introduced that result in device failure below the intrinsic limits for a discrete JFET. As the electric fields that are responsible for breakdown increase with decreasing critical dimensions in semiconductor devices, the addition of structures such as guard rings becomes desirable.

Guard rings are used to alter the charge distribution and electric field at surfaces and material interfaces of semiconductor devices. The interface between the guard ring and the substrate in which it is embedded forms a depletion region that enhances resistance to breakdown in an applied field. Typically, guard rings used in bipolar and BiCMOS processes are fabricated by diffusion.

Prior Art FIG. 3A shows a cross-sectional view of a guard ring used to isolate a bipolar transistor. An n-type substrate 305 has an n$^+$ layer 310 with a deposited collector contact 300. Within the n-type substrate is p-type well 320 forming the base of the transistor. The base 320 is connected to a base metal contact 335. Within the well 320 is an n$^+$ region that forms the emitter 325 of the transistor. The emitter is connected to an emitter metal contact 340. Oxide 330 provides insulation at the surface of the device, and between the base metal contact 335 and the emitter metal contact 340. Two p-type guard rings 345 surround the base 320 and emitter 325.

Prior Art FIG. 3B shows a top view of the semiconductor structure of FIG. 3A without oxide or metallization. The guard rings 345 isolate the emitter 325 and the base 320 at the surface of the device. Diffusion processes are well suited to fabrication of guard rings for bipolar devices; however, the processes and geometries of guard rings used for bipolar devices are not fully compatible with the process and structures used for JFETs and MESFETs.

SUMMARY OF INVENTION

Thus, a need exists for a guard ring structure that enhances the reverse breakdown characteristics for JFETs and MESFETs. There is also a need for a method of fabricating guard rings that is compatible with the processes used to fabricate JFETs and MESFETs.

Accordingly, the present invention provides a guard ring structure that is applicable to JFETs and MESFETs, and is compatible with the processes used for fabrication of JFETs and MESFETs. The geometry of the guard ring structure contributes to the process compatibility, and also optimizes the breakdown characteristics for the device with which it is associated.

A method for fabricating a floating guard ring structure for JFETs and MESFETs is disclosed. Trenches are etched in a semiconductor substrate for fabrication of a gate structure for a JFET or MESFET. At time the gate trenches are etched, guard ring trenches are also etched. The process used to fabricate the gate p-n junction or Schottky barrier at the bottom of the gate trenches is also used to fabricate the guard ring at bottom of the guard ring trenches. The separation between the guard ring trenches is normally between 1.0 to 3.0 times greater than the separation between the gate trenches.

In another embodiment of the present invention, the guard ring structure described above is used in conjunction with an integrated circuit comprising an enhancement mode JFET. The integrated circuit may be a logic circuit in which the JFET is part of a power conditioning or the integrated circuit may be a power conditioning circuit comprising logic circuits for control.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

Prior Art

Prior Art

Prior Art

Prior Art

DESCRIPTION OF THE PREFERRED EMBODIMENTS

In the following detailed description of the present invention, a guard ring structure and a method for fabricating the structure, numerous specific details are set forth in order to provide a thorough understanding of the present invention. However, it will be obvious to one skilled in the art that the present invention may be practiced without these specific details. In other instances well known methods involving photolithography, deposition and etch, etc., and well known structures such as ohmic contacts and barrier metallization, etc., have not been described in detail so as not to unnecessarily obscure aspects of the present invention.

U.S. Pat. No. 6,251,716 entitled "JFET Structure and Manufacture Method for Low On-Resistance and Low Voltage Application," issued Jun. 26, 2001, and assigned to the assignee of the present invention, is hereby incorporated herein by reference.

Figure 1:
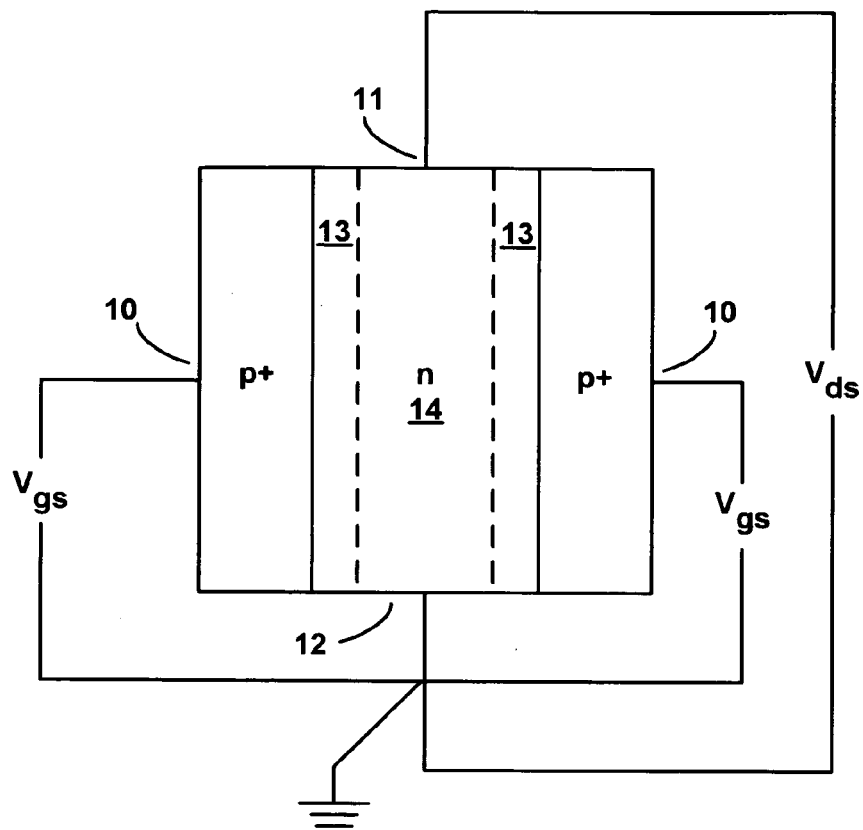
FIG. 1 shows a general schematic for an n-channel depletion mode junction field effect transistor (JFET).
Figure 2:
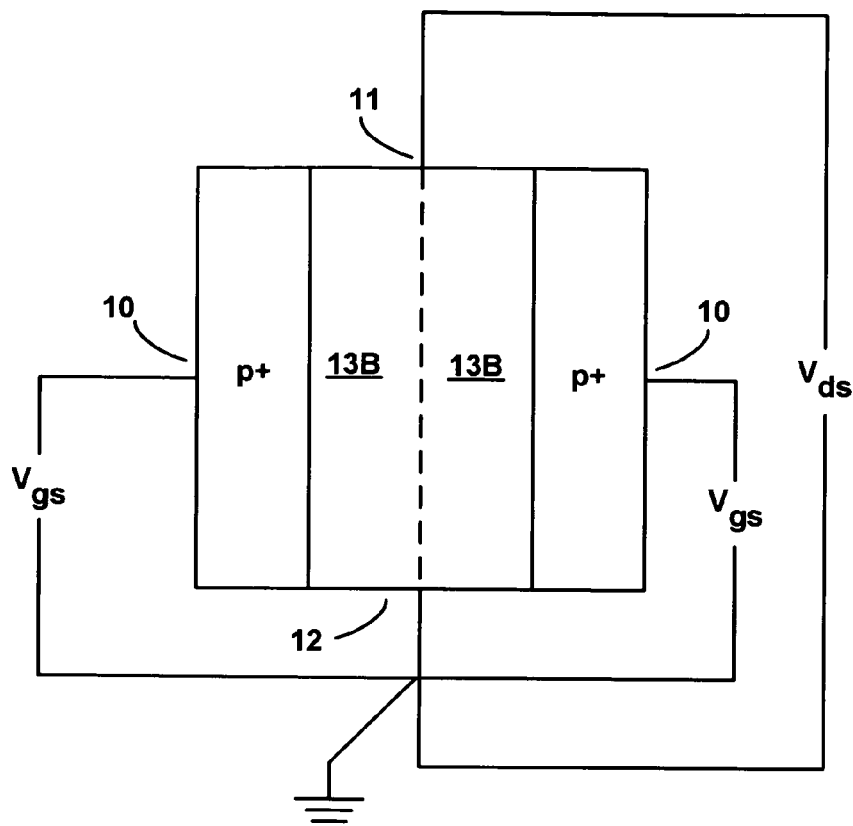
FIG. 2 shows a general schematic for an n-channel enhancement mode junction field effect transistor (JFET).
Figure 3A:
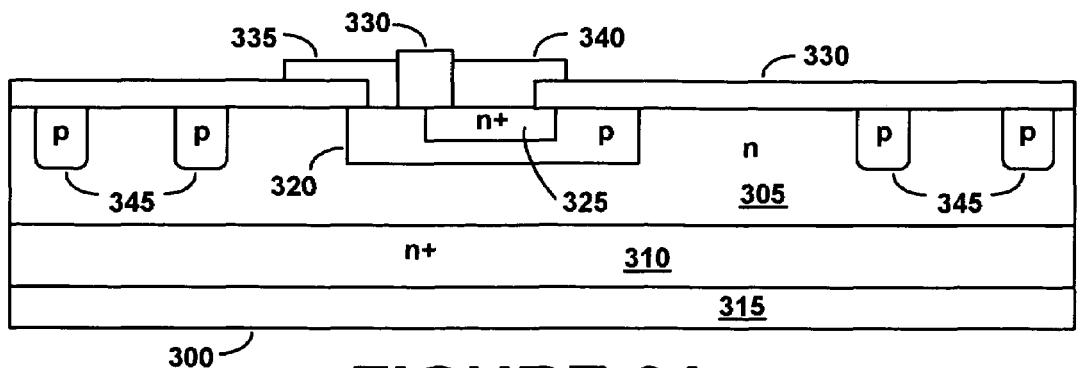
FIG. 3A shows a cross-sectional view of a conventional bipolar transistor structure with diffused guard rings.
Figure 3B:
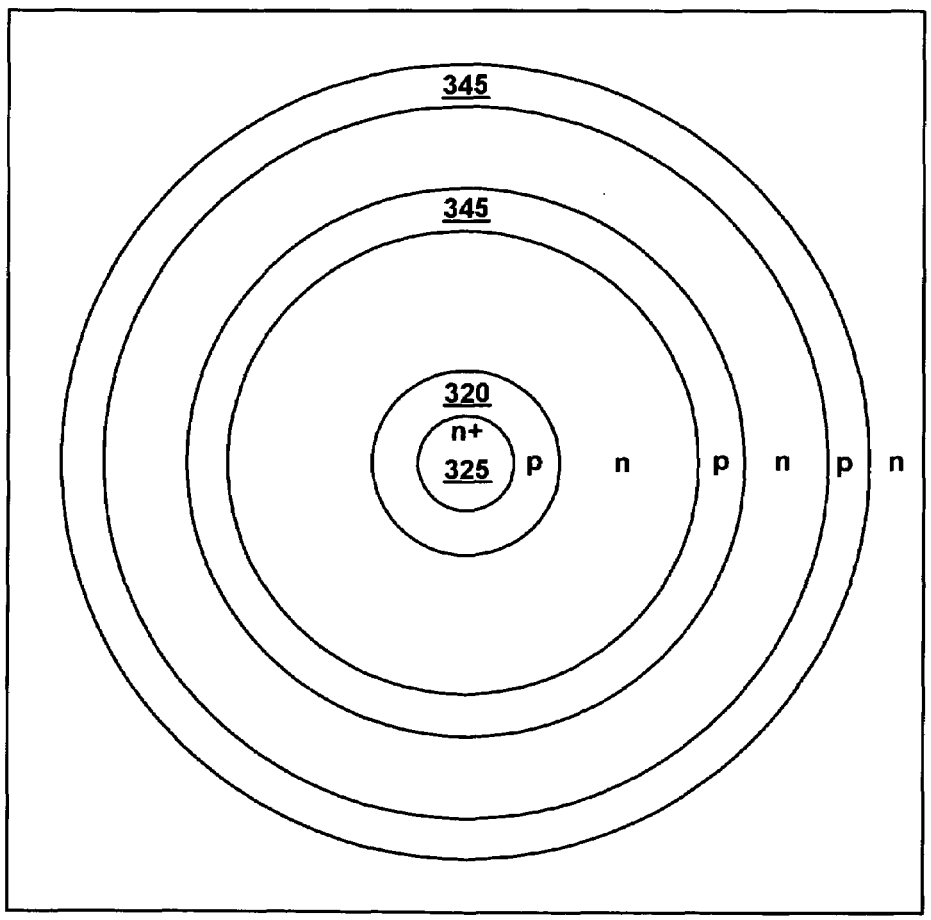
FIG. 3B shows a top view of conventional bipolar transistor structure with diffused guard rings.
Figure 4:
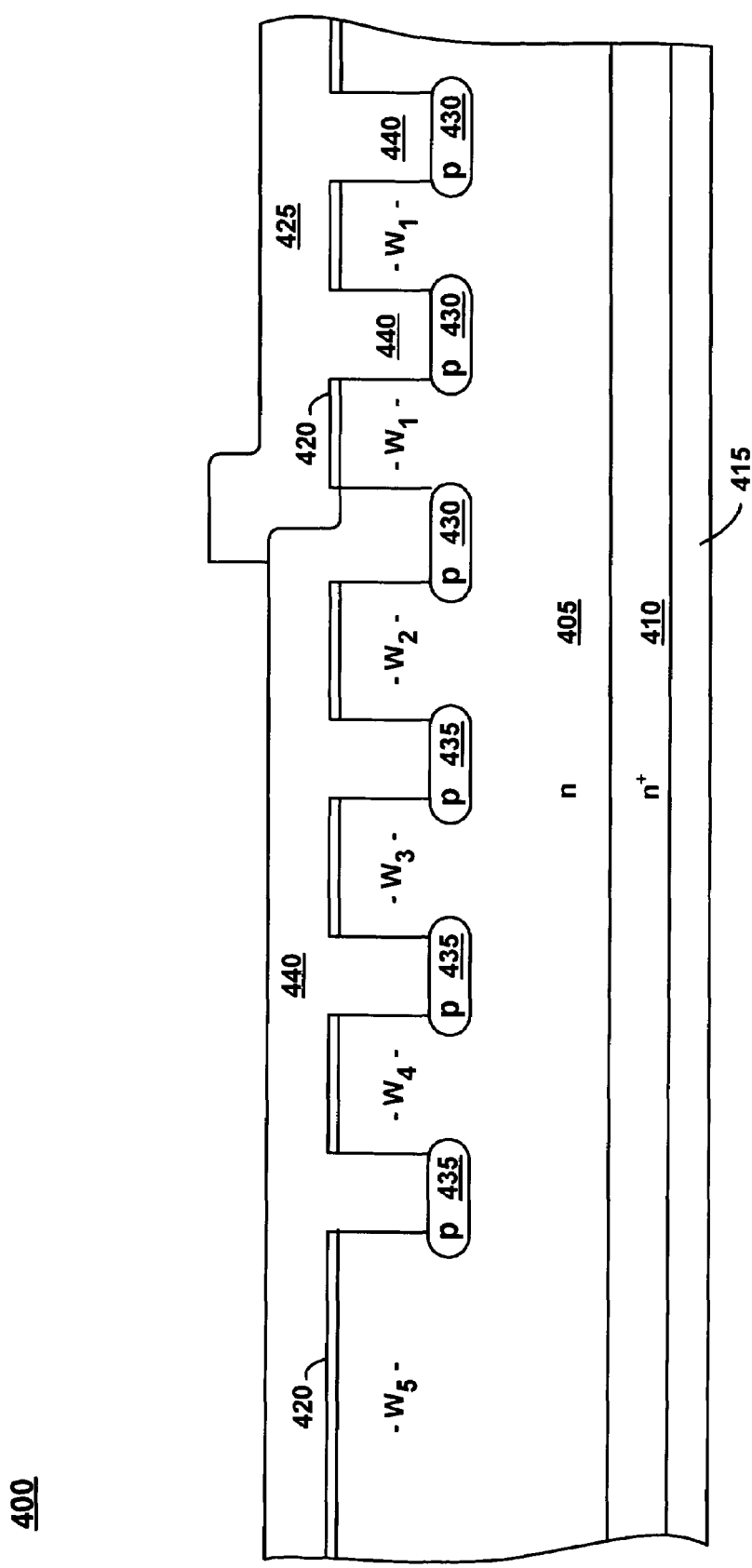
FIG. 4 shows a cross-section of an n-channel JFET with a guard ring structure in accordance with an embodiment of the present claimed invention.

FIG. 4 shows a cross-section of an n-channel JFET 400 with a floating guard ring structure 435 in accordance with an embodiment of the present claimed invention. An n-type substrate 405 has an $n^+$ layer 410 on the bottom for connection to a drain metal layer 415. The substrate 405 also has an $n^+$ layer 420 on the top for connection to a source metal layer 425. The $n^+$ layers provide a surface for an ohmic contact. Although the example of FIG. 4 shows an n-channel device, a complementary p-channel device could be realized substituting p-type material for n-type and n-type material for p-type. In a complementary p-channel device, the layers 410 and 420 would be $p^+$.

As can be seen in the example of FIG. 4, there are six trenches etched into the substrate 405. The three gate trenches have a gate 430 at the bottom. The gates 430 are electrically interconnected (not shown) and have a uniform spacing equal to $W_1$. The region between adjacent gate trenches forms the channel region of the JFET. The width $W_1$ and the doping characteristics of the gate and substrate determine whether the JFET is a depletion mode device or an enhancement mode device.

The spacing $W_2$ between the interior guard ring 435 adjacent to the gate 430 is selected on the basis of the operational mode of the device, and is also relative to the width $W_1$. Each of the guard rings 435 floats independently, and has a depletion region at the interface to the n-type substrate. Separation $W_2$ and separations $W_3$ and $W_4$ are selected such that the guard ring depletion regions sufficiently bridge the separation to prevent vertical breakdown in the region between the guard rings and between the guard rings and the gate. W2, W3, and W4 must also be kept sufficiently large to prevent punchthrough between the gate and the guard rings. Punchthrough occurs when a depletion region associated with a reverse biased junction is limited in extension by another depletion region or a differently doped region. With increasing voltage the depletion region width is fixed and breakdown ensues.

The breakdown resistance provided by the guard rings is due to the depletion regions formed at the interface between the guard ring and the substrate. The depletion regions associated with $W_2$ between the gate 430 and the inner floating guard ring 435 will tend to see a greater variability due to applied gate voltage than will the depletion regions associated with W3 and W4 between the floating guard rings 435. Thus, $W_2$ may have a different value than $W_1$ and $W_3$, with $W_3$ and $W_4$ being equal.

The surface convolution due to the guard ring trenches and the use of multiple guard rings contribute to the enhanced resistance to lateral surface breakdown. The appropriate selection of widths $W_2$, $W_3$, $W_4$, and $W_5$, provide enhanced resistance to vertical breakdown. The required resistance to breakdown in a given region may be influenced by interconnect metal (not shown) that may be deposited on the oxide 440 over the guard rings 435. Thus, $W_2$, $W_3$, $W_4$, and $W_5$, may not be equal, with a small spacing being used under sensitive areas and a larger spacing being used in vacant or non-critical areas.

Depending upon the doping characteristics of the device and the operating parameters, the ratio of guard ring spacings $W_2$, $W_3$, $W_4$, and $W_5$, and the gate spacing $W_1$ may be between 1.0 and 3.0.

A preferred ratio between the guard ring spacings $W_2$, $W_3$, $W_4$, and $W_5$, and the gate spacing $W_1$ for a JFET in silicon is between 1.4 and 1.6. Assuming $W_1$ to be 0.5 microns in the example of FIG. 4, $W_2$, $W_3$, $W_4$ would be set at between 0.6 to 0.8 microns for three guard rings. For high voltage devices, multiple guard rings numbering greater than ten may be used (e.g., at voltages greater than 100 volts).

For purposes of this disclosure, p-n junctions and Schottky barriers are referred to collectively as barrier junctions. The gates 430 and guard rings 435 may be formed by using implant and anneal, or other processes to form a p-n junction, or a Schottky barrier may be fabricated by metal gates 430 and guard rings 435 deposited on the semiconductor (e.g., Al on GaAs). From a process standpoint, the gates and guard rings are virtually indistinguishable, thus there is minimal additional overhead associated with fabrication of the guard rings. The guard rings are distinguished from the gates by their dimensions, spatial relationship, and interconnect (or lack thereof). Since the trench etch and barrier junction formation process is essentially identical for the guard rings and gates, they are located at the same distance from the surface of the device.

Figure 5:
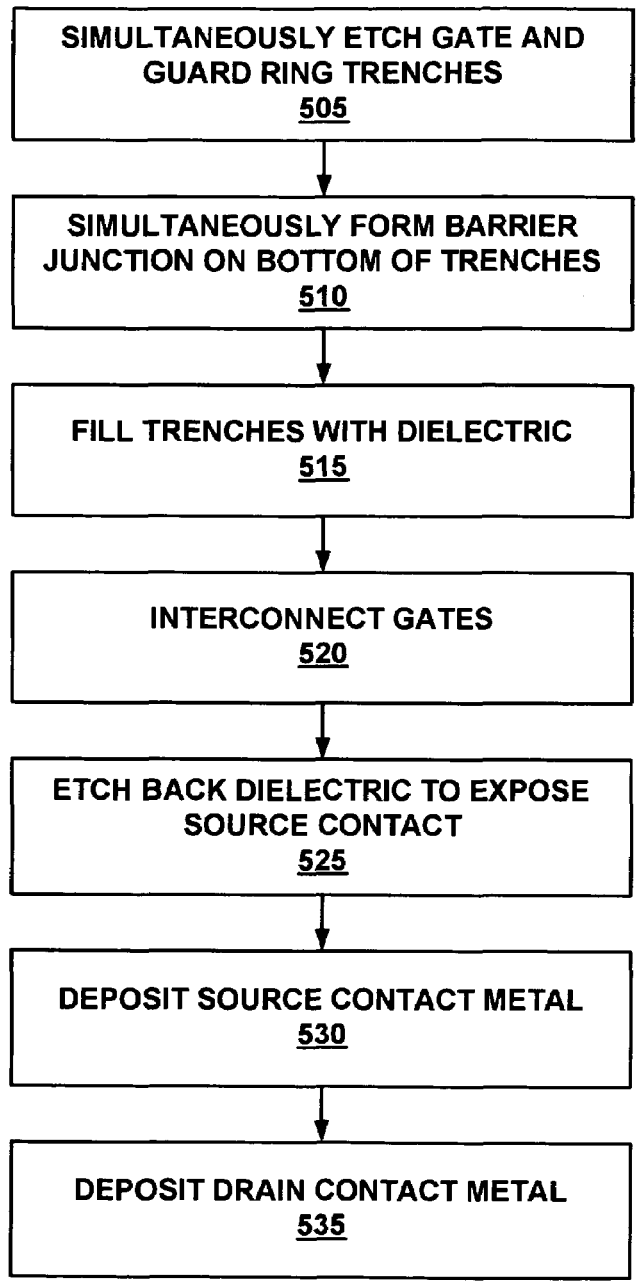
FIG. 5 shows a flow chart diagram for a method of fabricating a guard ring structure in accordance with an embodiment of the present claimed invention.

FIG. 5 shows a flow chart diagram 500 for a method of fabricating a guard ring structure for a JFET or MESFET in accordance with an embodiment of the present claimed invention.

In step 505, guard ring trenches and gate trenches are simultaneously etched in the surface of a semiconductor substrate. The guard ring trenches form a nested series of closed loops that surround the gate trenches. The gate trenches may be arranged to form a grid pattern.

In step 510, a barrier junction is simultaneously formed on the bottom of the gate trenches and the guard ring trenches. The barrier junction may be either a p-n junction (JFET) or a Schottky barrier (MESFET). The barrier junction may be formed by chemical vapor deposition (CVD), implant and anneal, or other suitable process.

In step 515, the gate and guard ring trenches are filled with a dielectric. For a silicon device, the dielectric may be silicon dioxide. For a III-V compound semiconductor the dielectric may be silicon nitride.

In step 520, the gates are interconnected and an external contact provided via gate contact mask and metal mask. Depending upon the layout of the trenches, the interconnection may be provided by intersection of the trenches (e.g., a grid layout). A surface contact may be provided by a via through the trench fill dielectric.

In step 525, the dielectric is etched back to expose a source contact region. The source contact region is the region of the substrate that is essentially bounded by the gate (e.g., the islands formed by a grid gate layout).

In step 530, source contact metal is deposited. In general, the source contact metal will cover both the source region exposed in step 525 and the surface of the oxide fill in the gate trenches. The metal is typically selected to provide an ohmic contact to both source and gate during metal mask/etch process. In step 535, drain contact metal is deposited. The drain contact metal is also typically selected to provide an ohmic contact.

The guard ring structure of the present invention enables JFETs and MESFETs to achieve breakdown voltages at or near the bulk values for the reverse biased barrier junctions within the device. This improvement in performance is achieved without the burden of additional processing steps such as diffusing a guard ring or beveling a die.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A field effect transistor (FET) comprising:
   a semiconductor substrate comprising a top surface and a bottom surface, wherein the top and bottom surfaces each comprise a heavily doped layer to provide an ohmic contact;
   a plurality of gate trenches formed in the top surface, each comprising a bottom, wherein a gate is disposed on the bottom of said gate trenches, forming a barrier junction, wherein said gate trenches are separated by a width $W_1$;
   a plurality of guard ring trenches formed in the top surface with a depth approximately equal to the depth of said gate trenches, each comprising a bottom,, wherein a guard ring is disposed on the bottom of said guard ring trenches, forming a barrier junction, wherein said guard ring trenches are separated by a width $W_2$ that is greater than $W_1$;
   a plurality of source regions on said top surface substantially surrounded by said gate trenches;
   a source contact disposed on the source regions; and,
   a drain contact disposed on the bottom surface of said substrate.

2. The FET of claim 1, wherein said barrier junction is a Schottky barrier.

3. The FET of claim 1, wherein said barrier junction is a p-n junction.

4. The FET of claim 1, wherein said width $W_2$ is 1.0 to 3.0 times greater than said width $W_1$.

5. The FET of claim 1, wherein said FET is a junction field effect transistor (JFET).

6. A field effect transistor (FET) comprising:
   a substrate comprising top and bottom surfaces, each comprising a doped layer;
   a plurality of gate trenches formed in the top surface, each gate trench comprising a bottom, wherein a gate is disposed on said trench bottom, forming a barrier junction at an interface with said substrate, and wherein said plurality of gate trenches are separated by a width, $W_1$;
   a plurality of guard ring trenches formed in the top surface with a depth approximately equal to the depth of said gate trenches, each guard ring trench comprising a bottom, wherein a guard ring is disposed on the bottom of said guard ring trenches, forming a barrier junction at the interface with said substrate, wherein said guard ring trenches are separated by a width $W_2$ that is greater than $W_1$;

a plurality of source regions on said top surface;

a source contact; and a drain contact.

7. The FET of claim 6, wherein said barrier junction is a Schottky barrier.

8. The FET of claim 6, wherein said barrier junction is a p-n junction.

9. The FET of claim 6, wherein said width $W_2$ is 1.0 to 3.0 times greater than said width % $W_1$.

10. The FET of claim 9, wherein said width $W_2$ is 1.4 to 1.6 times greater than said width % $W_1$ and said substrate comprises silicon.

11. The FET of claim 6, wherein said FET is a junction field effect transistor (JFET).

12. The FET of claim 6, wherein said FET is a metal-semiconductor field effect transistor (MESFET).

13. The FET of claim 6, further comprising an additional guard ring trench separated from said plurality of guard ring trenches by a width $W_3$, wherein $W_3$ is different from $W_2$.

14. The FET of claim 6, wherein said substrate comprises an n-type semiconductor.

15. The FET of claim 6, wherein said substrate comprises a p-type semiconductor.

16. The FET of claim 6, wherein said FET is an enhancement mode device.

17. The FET of claim 6, wherein said FET is a depletion mode device.

* * * * *